United States Patent
Colburn et al.

(10) Patent No.: US 7,947,907 B2
(45) Date of Patent: May 24, 2011

(54) ELECTRONICS STRUCTURES USING A SACRIFICIAL MULTI-LAYER HARDMASK SCHEME

(75) Inventors: Matthew Earl Colburn, Hopewell Junction, NY (US); Ricardo Alves Donaton, Cortlandt Manor, NY (US); Conal E Murray, Yorktown Heights, NY (US); Satyanarayana Venkata Nitta, Poughquag, NY (US); Sampath Purushothaman, Yorktown Heights, NY (US); Sujatha Sankaran, Wappingers Falls, NY (US); Thedorus Eduardos Standaert, Pine Bush, NY (US); Xiao Hu Liu, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 12/098,895

(22) Filed: Apr. 7, 2008

(65) Prior Publication Data

US 2008/0251284 A1    Oct. 16, 2008

Related U.S. Application Data

(62) Division of application No. 11/130,078, filed on May 16, 2005, now Pat. No. 7,371,684.

(51) Int. Cl.
*H05K 1/03* (2006.01)

(52) U.S. Cl. ........ 174/255; 174/256; 174/257; 174/258; 174/261; 174/250

(58) Field of Classification Search .................. 174/250, 174/253, 255–262, 264–266; 257/E21.024, 257/E21.257, E21.314, E21.581; 361/790, 792, 793, 795

See application file for complete search history.

(56) References Cited

U.S. PATENT DOCUMENTS

| | | | | |
|---|---|---|---|---|
| 5,464,683 A | * | 11/1995 | Rudigier et al. | 428/216 |
| 5,851,896 A | * | 12/1998 | Summerfelt | 438/396 |
| 7,199,046 B2 | * | 4/2007 | Wetzel et al. | 438/637 |
| 2005/0062165 A1 | | 3/2005 | Saenger et al. | |
| 2005/0099760 A1 | * | 5/2005 | Park | 361/306.3 |
| 2006/0014374 A1 | * | 1/2006 | Barth et al. | 438/622 |

OTHER PUBLICATIONS

L. G. Gossett et al; "Integration of SiOC air gaps in copper interconnects"; Miceoelectronic Engineering; vol. 70; pp. 274-279 (2003).
P.A. Kohl; "Air-gaps for electrical interconnections"; Electrochemical and Solid-State Letters, vol. 1; pp. 49-51 (1998).

(Continued)

*Primary Examiner* — Dameon E Levi
*Assistant Examiner* — Hoa C Nguyen
(74) *Attorney, Agent, or Firm* — Theresa O'Rourke Nugent; Nugent & Smith, LLP

(57) ABSTRACT

An electronic structure including a substrate having a having a dielectric layer with at least one metallic interconnect structure within and a dielectric barrier layer above the dielectric layer, and a multi-layer hardmask stack coated with a self-assembled layer, where the self-assembled layer is a pattern of nanoscale and/or microscale voids which are generated into the dielectric barrier layer and into the dielectric layer next to the metallic interconnect structure to create columns in the dielectric barrier layer and dielectric layer therein. Electronics structures prepared with the process are useful to prepare electronics devices, such as computers and the like.

20 Claims, 6 Drawing Sheets

OTHER PUBLICATIONS

J. Alexander Liddle et al; "Lithographically directed self-assembly of nanostructures"; J. Vac. Sci. Technol. B, vol. 22(6), pp. 3409-3414 (Nov./Dec. 2004).

T. Thurn-Albrecht, et al.; "Ultrahigh-Density Nanowire Arrays Grown in Self-Assembled Diblock Copolymer Templates"; Science, vol. 290, pp. 2126-2129 (Dec. 15, 2000).

C. T. Black, et al.; "Integration of self-assembled diblock copolymers for semiconductor capacitor fabrication"; Applied Physics Letters, vol. 79 No. 3; pp. 409-411 (Jul. 16, 2001).

K. W. Guarini et al.; "Process integration of self-assembled polymer templates into silicon nanofabrication"; J. Vac. Sci. Technol. B, vol. 20 (6); pp. 2788-2792 (Nov./Dec. 2002).

Seung Hyun Kim et al; "Highly Oriented and Ordered Arrays form Block Copolymers via Solvent Evaporation"; Advanced Materials, vol. 16, No. 3; pp. 226-231 (Feb. 3, 2004).

A. P. Liz et al; "Polycrystalline and Monocrystalline Pore Arrays with Large Interpore Distance in Anodic Alumina"; Electrochemical and Solid-State Letters; vol. 3, No. 3; pp. 131-134 (2000).

Kazuhiko Fukutani et al.; "Ultrahigh pore density nanoporous filmsproduced by the phase separation of eutectic Al-Si for template-assisted growth of nanowire arrays"; Advanced Materials; Vo.1 16, No. 1; pp. 1456-1460 (Aug. 18, 2004).

Erik Schäfer et al; "Electrically induced structure formation and pattern transfer"; Nature; vol. 403; pp. 874-877 (Feb. 24, 2000).

* cited by examiner

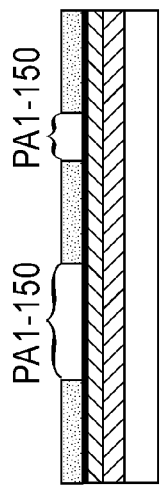
FIG. 1A
Prior Art
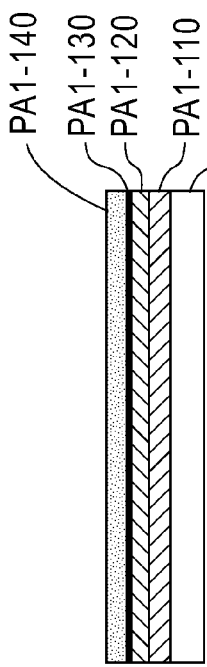
FIG. 1B
Prior Art
FIG. 1C
Prior Art
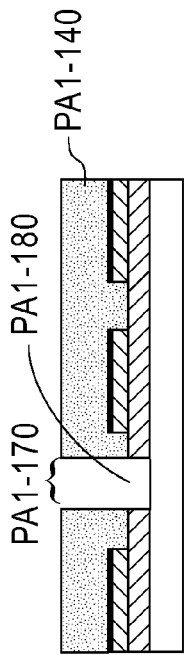
FIG. 1D
Prior Art
FIG. 1E
Prior Art
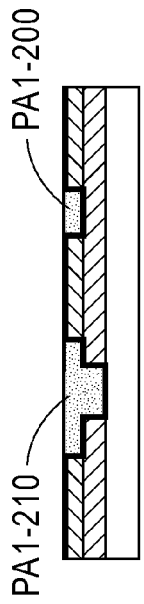
FIG. 1F
Prior Art
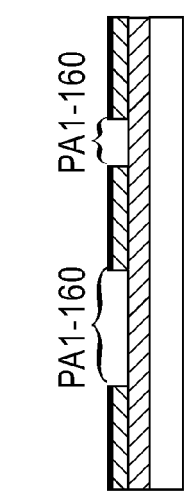
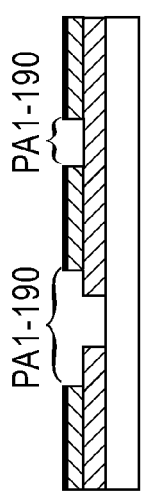
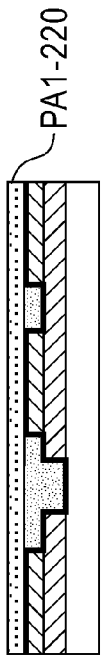
FIG. 1G
Prior Art

US 7,947,907 B2

ELECTRONICS STRUCTURES USING A SACRIFICIAL MULTI-LAYER HARDMASK SCHEME

CROSS REFERENCE TO RELATED APPLICATIONS

This is a divisional application of co-pending application Ser. No. 11/130,078 filed on May 16, 2005.

BACKGROUND OF THE INVENTION

1. Field of the Invention

The present invention relates generally to a process for preparing an electronics structure using a sacrificial multi-layer hardmask scheme, to a process of preparing an electronic device incorporating the electronics structure preparation process, and to electronics structures useful in both processes.

2. Description of Related Art

The fabrication of Very-Large Scale Integrated (VLSI) or Ultra-Large Scale Integrated circuit (ULSI) requires metallic wiring that connects individual devices in a semiconductor chip, to one another. One method of creating this wiring network on such small scale is the dual damascene (DD) process schematically shown in FIG. 1. In the standard DD process, an interlayer dielectric (ILD), shown as two layers PA1-110, PA1-120 is coated on the substrate PA1-100, FIG. 1a. The via level dielectric PA1-110 and the line level dielectric PA1-120 are shown separately for clarity of the process flow description. In general, these two layers can be made of the same or different insulating films and in the former case applied as a single monolithic layer. A hard mask layer PA1-130 is optionally employed to facilitate etch selectivity and to serve as a polish stop as will be seen later. The wiring interconnect network consists of two types of features: line features that traverse a distance across the chip, and the via features which connect lines in different levels together. Historically, both layers are made from an inorganic glass like silicon dioxide (SiO.sub.2) or a fluorinated silica film deposited by plasma enhanced chemical vapor deposition (PECVD).

In the dual damascene process, the position of the lines PA1-150 and the vias PA1-170 are defined lithographically in photoresist layers, PA1-140, depicted in FIGS. 1b and 1d, and transferred into the hard mask and ILD layers using reactive ion etching processes. The process sequence shown in FIG. 1 is called a line-first approach because the trench PA1-160 which will house the line feature is etched first, see FIG. 1c. After the trench formation, lithography is used to define a via pattern PA1-170 in the photoresist layer PA1-140 which is transferred into the dielectric material to generate a via opening PA1-180, FIG. 1d. The dual damascene trench and via structure PA1-190 is shown in FIG. 1e after the photoresist has been stripped. This structure PA1-190 is coated with a conducting liner material or material stack PA1-200 that serves to protect the conductor metal lines and vias and serve as an adhesion layer between the conductor and the ILD. PA1-200 also serves to facilitate electroplating. This recess is then filled with a conducting fill material PA1-210 over the surface of the patterned substrate. The fill is most commonly accomplished by electroplating of copper although other methods such as chemical vapor deposition (CVD) and other materials such as Al or Au can also be used. The fill and liner materials are then chemically-mechanically polished (CMP) to be coplanar with the surface of the hard mask and the structure at this stage is shown in FIG. 1f. A capping material PA1-220 is deposited over the metal or as a blanket film, as is depicted in FIG. 1g to passivate the exposed metal surface and to serve as a diffusion barrier between the metal and any additional ILD layers to be deposited over them. Silicon nitride, silicon carbide, and silicon carbonitride films deposited by PECVD are typically used as the capping material PA1-220. This process sequence is repeated for each level of the interconnects on the device. Since two interconnect features are defined to form a conductor in-lay within an insulator by a single polish step, this process is designated a dual damascene process.

As with any circuit, semiconductor chips are prone to signal propagation delays which depend on the product of the line resistance, R, and the interconnect capacitance, C. In order to improve the performance of semiconductor chips, manufacturers have reduced the resistivity of the metal used in fabrication by replacing aluminum wiring by copper. By moving to lower dielectric constant (k) materials, manufacturers have also begun to reduce the capacitance, C, in the circuit. The common terminology used to describe the dielectric films is to classify them as standard k ($4.5<k<10$), low k ($k<3.0$), ultra low k ($2.0<k<2.5$) and extreme low k ($k<2.0$). Ultra low k and extreme low k dielectrics generally tend to be porous with intentionally engineered voids in their structure. Since the lowest dielectric constant possible is defined by air or vacuum ($k.sub.vac=1$), many have developed means to produce voids in the dielectric. When the void volume extends and occupies substantial contiguous regions of the gaps between the lines one achieves an interconnect structure wherein the lines are nominally separated by air or vacuum as the ILD material. In the following descriptions, the term "air bridge" is used to describe such an interconnect structure to distinguish it from structures wherein the ILD is porous with void volume dispersed randomly within a nominally contiguous solid dielectric. Examples of air bridges can be found in V. Arnal et al., Microelectronic Engineering, 2003, Volume 70, pp. 274-279, and P. A. Kohl et al., Electrochemical and Solid-State Letters, 1998, Volume 1, Number 1, pp. 49-50.

The use of bottom-up approaches to semiconductor fabrication has grown in interest within the scientific community (J. Alex Liddle et al., J Vac. Science Technology, November/December 2004, Volume 22, Number 6, pp. 3409-3414; T. P. Russell et al., Science, Dec. 15, 2000, Volume 290, pp. 2126-2129; C. T. Black et al., Applied Physics Letters, Jul. 16, 2001, Volume 79, Number 3, pp. 409-411; and K. W. Guarini et al., J Vac. Science Technology, November/December 2002, Volume 20, Number 6, pp. 2788-2792). One such approach utilizes block copolymers for generating sub-optical ground rule patterns. In particular, one illustrative use is forming a "honeycomb" structure within a poly(methyl methacrylate-b-styrene) block copolymer. In the case of a cylindrical phase diblock having a minor component of PMMA, the PMMA block can phase separate to form vertically oriented cylinders within the matrix of the polystyrene block upon thermal anneal (T. P. Russell et al., Science, Dec. 15, 2000, Volume 290, pp. 2126-2129).

This prior art process is shown in FIG. 2. A substrate PA2-100 is coated (optionally) with a random copolymer PA2-110. This copolymer is affixed to the surface and excess material is washed away. A block copolymer PA2-120 is coated on the top surface of the random-substrate stack as shown in FIG. 2a. The block copolymer PA2-120 is annealed with heat and/or actinic irradiation PA2-130 allowing for phase separation of the immiscible polymer blocks PA2-121 and PA2-122. The annealed film is then developed to reveal a pattern PA2-123 that is commensurate with the positioning of one of the blocks in the copolymer. For simplicity, the block is shown as complete removed although this is not required. Other means of nanocolumnar formation in diblock copolymer films have been shown such as 'solvent-mediated formation' by T. Russell (T. P. Russell et al., Advanced Materials, Feb. 3, 2004, Volume 16, Number 3, pp. 226-231).

Since block copolymers have a natural length scale associated with their molecular weight and composition, the morphology of a phase-separated block copolymer can be tuned to generate cylinders of a specific width and on a specific pitch. Literature shows the use of UV exposure to cause the PMMA to decompose into smaller molecules (T. P. Russell et al., Science, Dec. 15, 2000, Volume 290, pp. 2126-2129) and, further, developed using glacial acetic acid to remove the small molecules. Others simply develop the acetic acid to reveal the HCP pattern (K. W. Guarini et al., J Vac. Science Technology, November/December 2002, Volume 20, Number 6, pp. 2788-2792 and C. T. Black et al., Applied Physics Letters, Jul. 16, 2001, Volume 79, Number 3, pp. 409-411).

In FIG. 3, one prior art approach to air bridge construction is shown. It incorporates the prior art build shown in FIG. 1 and patterning techniques such as that shown in FIG. 2. In this process, a low-k structure is constructed after metal deposition steps to form the interconnects. For the purpose of reference, these types of processes are designated in the present application as metal-then-air bridge (MAB) approaches consistent with the process sequence used. Most processes that follow this approach begin with the standard DD fabrication sequence. Thus the process flow is consistent with FIG. 1. After the metallization step and either before or after the dielectric capped deposition, a nanometer scale pattern is transferred into the underlying interconnect structure and capped with a barrier material PA3-140. Thus, for example, the structure shown in FIG. 3 is identical to the DD structure shown in FIG. If except the dielectric stack has nanocolumnar voids or pillars PA3-150 in the dielectric stack PA3-120 on the substrate PA3-100. Additionally it can be seen that the dielectric PA3-110 under the metallic lines PA3-130 is solid. Additional levels can then be fabricated in the same manner above the air bridge level.

One disadvantage to this process is the exposure of the metallic line to harsh reactive ion etch processes generally required for patterning of the dielectric. It is therefore clear that an alternate approach that will circumvent the above detailed limitation of this MAB approach is needed in order to fabricate reliable multilevel air bridge structures.

SUMMARY OF THE INVENTION

These and other objects were met with the present invention, which relates, in a first embodiment to an electronics structure including a substrate stack having a dielectric layer with at least one metallic interconnect structure within and a dielectric barrier layer above the dielectric layer; a multi-layer hardmask stack with a patterned self-assembled layer on the substrate, and a blocking layer on the patterned self-assembled layer; with the pattern including nanoscale and/or microscale voids generated into the dielectric barrier layer and into the dielectric layer next to the metallic interconnect structure to create columns in the dielectric barrier layer and dielectric layer therein.

A second embodiment of the present invention relates to an electronic structure including a substrate stack having a dielectric layer with at least one metallic interconnect structure within and a dielectric barrier layer above the dielectric layer and a multi-layer hardmask stack coated on the substrate stack, having a self-assembled pattern, with a topmost layer of the multi-layer hardmask stack having a pattern of nanoscale and/or microscale voids generated into the dielectric barrier layer and into the dielectric layer next to the metallic interconnect structure to create columns in the dielectric barrier layer and dielectric layer therein.

In a third embodiment, the present invention relates to an electronic structure including a substrate stack having a dielectric layer with at least one metallic interconnect structure within having at least one metallic line and a dielectric barrier layer above the dielectric layer; and a strippable multi-layer hardmask stack with a self-assembled pattern, having at least one of a planarizing material, an etch stop and a rework surface are; and a diblock copolymer resist coated on a topmost layer of the multi-layer hardmask stack, where pattern is nanoscale and/or microscale voids generated into the dielectric barrier layer and into the dielectric layer next to the metallic interconnect structure to create columns in the dielectric barrier layer and dielectric layer therein.

In a fourth embodiment, the present invention relates to an electronic structure which is a computer including the electronic structure.

BRIEF DESCRIPTION OF THE DRAWINGS

The references herein to the Figures are to the accompanying drawings, wherein:

FIG. 1 is a schematic of the prior art dual damascene process;

DETAILED DESCRIPTION OF THE INVENTION

Figure 2A:
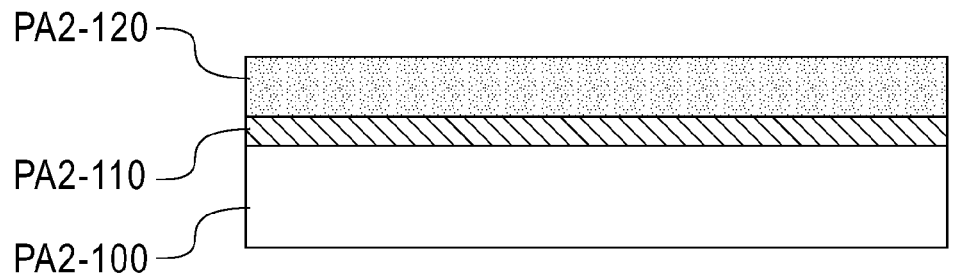
FIG. 2 is a schematic of a bottom-up approach to prior art semiconductor fabrication.
Figure 2B:
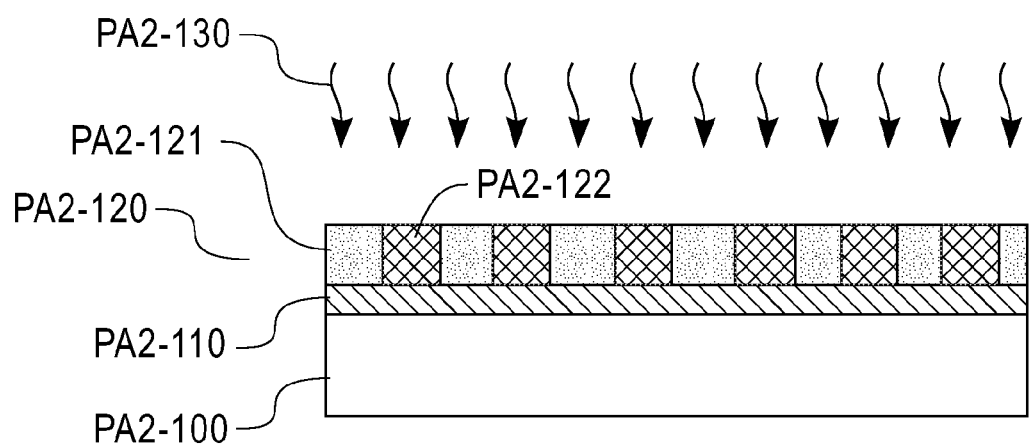
Figure 2C:
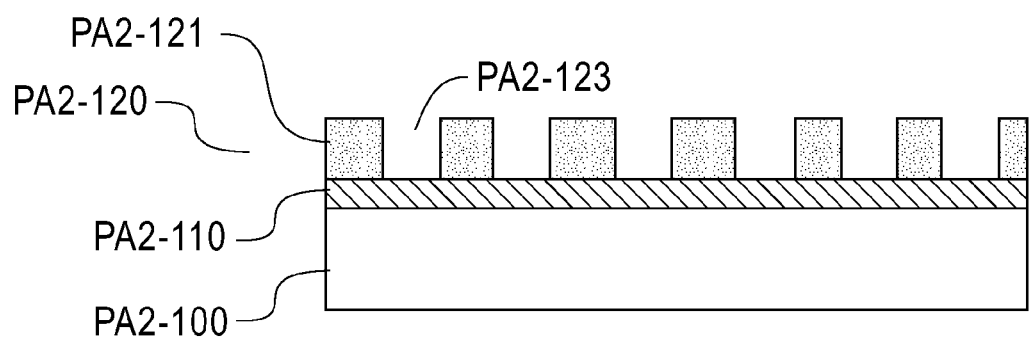
Figure 3:
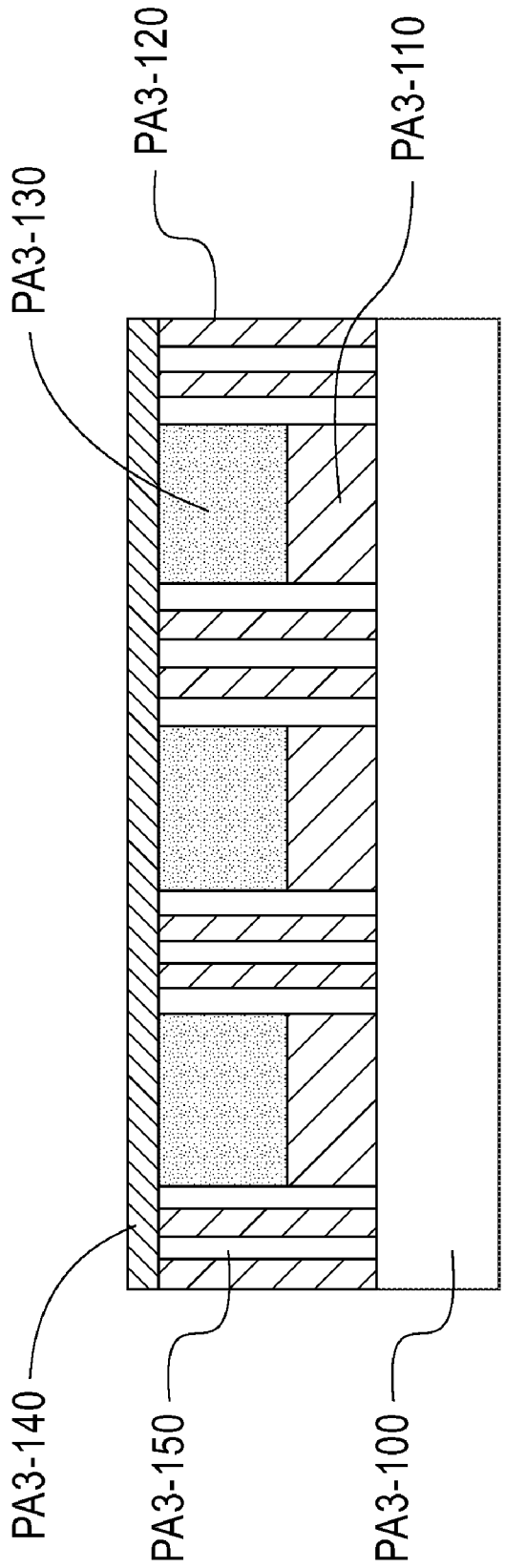
FIG. 3 is a schematic of a prior art approach to air bridge construction.

A key to the present invention is the use of a sacrificial hardmask/planarizing layer(s) or stack into which the pattern developed in the resist is transferred and which in turn is used to withstand the blockout mask resist coating/developing steps as well as the transfer of the pattern into the underlying cap/ILD.

In a preferred embodiment, the resist is a self-assembled layer such as a diblock copolymer film or anodized aluminum or aluminum-silicon ($Al_xSi_y$) alloy.

In an especially preferred embodiment, the resist is a diblock copolymer, and the pattern developed therein comprises nanocolumns and/or microcolumns. Following the teachings of the present invention, such nanocolumns and/or microcolumns can be transferred deeper into the ILD than with the diblock alone. Further, the blockout mask can be coated on top of the diblock pattern (which at this point has already been transferred into the sacrificial hardmask which is either made of LTO or Si ARC) without exposing the diblock materials themselves to the harsh chemistries used in developing photoresists.

In this preferred embodiment, the process may involve, for example, developing a pattern in the resist by annealing the diblock copolymer with heat and/or actinic radiation to allow phase separation of the two polymer blocks. Once phase separation has been achieved and the nanocolumns are allowed to migrate to the low-energy configuration (i.e., vertically oriented), the pattern in the resist is revealed using either liquid or plasma development.

In one preferred embodiment, the substrate stack comprises a substrate and at least one metallic interconnect structure coated thereon. Preferably, the substrate comprises at least one semiconductor chip, microfluidic array, biochip, microseparation column and/or micro fuel cell. The at least one metallic interconnect structure comprises at least one dielectric, metallic line and/or dielectric barrier. The metallic interconnect structures may be any combination of lines and/or vias.

In another preferred embodiment, the multi-layer hardmask stack comprises at least one of a planarizing material, an etch stop and/or a rework surface. In a particularly preferred embodiment, the planarizing material exhibits plasma etch selectivity relative to a dielectric. In another particularly preferred embodiment, the multi-layer hardmask stack comprises an etch stop and/or a rework surface, and the etch stop and/or rework surface are strippable. Stripping can be performed in any of a number of well-known techniques in the prior art, but preference is given to stripping with hydrofluoric acid.

As noted previously, block copolymers have a natural length scale associated with their molecular weight and composition. In one preferred embodiment of the present invention, the pattern developed in the resist comprises a nanoscale pattern having a characteristic length-scale less than about 0.1 micron, most preferably less than about 0.05 micron. In another preferred embodiment, the pattern comprises a microscale pattern having a characteristic length-scale less than about 0.5 micron, most preferably between about 0.025 micron and about 0.5 micron.

Once the pattern has been developed in the resist layer, the pattern is transferred into the topmost layer of the hardmask stack by procedures well-known in the art. Thereafter, the resist layer becomes superfluous and can be stripped, again, by procedures well known in the art. A portion of the hardmask stack is then protectively blocked using a material inert to the etchant to be used to transfer the pattern into the substrate stack. Suitable blocking materials include a chemically amplified photoresist or non-chemically amplified photoresist. Blocking is preferably performed using conventional lithographical processes such as photo, electron beam, or extreme UV exposure.

Etchants useful to transfer the pattern into the lower levels of the hardmask stack and, thereafter, into the substrate stack include anisotropic etchants, which are well known to persons skilled in the art. These etchants typically etch in a single direction, and, thus, extend the pattern in a faithful manner. Suitable anisotropic etchants include but are not limited to plasmas containing one or more of the following: fluorocarbon, Ar, $N_2$, $O_2$, $H_2$, $NF_3$ based plasmas in a suitably designed reactive ion etched.

Once the unblocked pattern has been transferred below the bottommost layer of the hardmask stack, the hardmask stack itself becomes strippable and can be stripped. Accordingly, in a preferred embodiment, the inventive process comprises after step e), stripping off the multi-layer hardmask. Again, such stripping can be carried out using known materials and techniques.

In a preferred embodiment, the unblocked portion of the pattern can be transferred into the substrate stack by perforating a topmost layer of the substrate stack with the pattern, and exposing the topmost layer of the substrate stack to an etchant that removes material beneath the topmost layer of the substrate stack while leaving intact a non-perforated portion of the topmost layer of the substrate stack. Suitable etchants are all those mentioned above, and particular preference is given to but not limited to plasmas containing one or more of the following: fluorocarbon, Ar, $N_2$, $O_2$, $H_2$, $NF_3$ based plasmas in a suitably designed reactive ion etched.

In an especially preferred embodiment, the pattern comprises a plurality of nanoscale and/or microscale columns that are transferred into the substrate stack. In this embodiment, preferably, the material between a plurality of the nanoscale and/or microscale columns is removed to form an air bridge.

Electronics structures prepared in this fashion can be incorporated into electronics devices in the manners well known in the prior art. Non-limiting examples of such electronic devices include computers, servers, mainframes, datacom routers, telecom routers and electronic devices including computers, such as automobiles, airplanes, and the like, as well as camera equipment, computer equipment, such as printers, fax machines, scanners and the like, and household appliances, and personal electronic devices, such as CD-players, DVD-players, cassette tape recorders and the like.

The invention will now be described in even greater detail with reference to the following non-limiting example.

EXAMPLE

An electronics structure according to the present invention is constructed as depicted in FIG. 4. A substrate 4100 contains metallic interconnect structure; itself consisting of a dielectric 4100 and a lined metallic line 4120 which itself is capped with a dielectric barrier 4130. The substrate stack is coated with a material stack (4140, 4150, 4160). 4140 is a planarizing material that exhibits plasma etch selectivity relative to the dielectric 4110. 4150 is etch stop and/or rework surface relative to topmost hardmask 4160. In an especially preferred embodiment, the layer 4150 is chemically differentiated from the 4160 such that 4160 can be stripped relative to 4150 using conventionally etchants such as dilute hydrofluoric acid. The use of 4160 is optional. Depending on the underlying dielectric 4110, the layers 4140 and 4150 may be identical. Using a process demonstrated in the prior art (U.S. Pat. No. 2005/0062165, Saenger et al.), a block copolymer film 4170 is coated on the topmost hardmask 4160. The film is then annealed and developed according to the prior art technique to reveal the self-assembled pattern 4175 as shown in FIG. 4a. Preferably, a diblock copolymer is utilized, but this is only one possible method of generating a representative self-assembled pattern. Another method would be by anodization of Al according to A. P. Liz et al., Electrochemical and Solid-State Letters, 2000, Volume 3, Number 3, pp. 131-134 and K. Fukutani et al., Advanced Materials, 2004, Volume 16, Number 16, pp. 1456-1460.

Figure 4A:
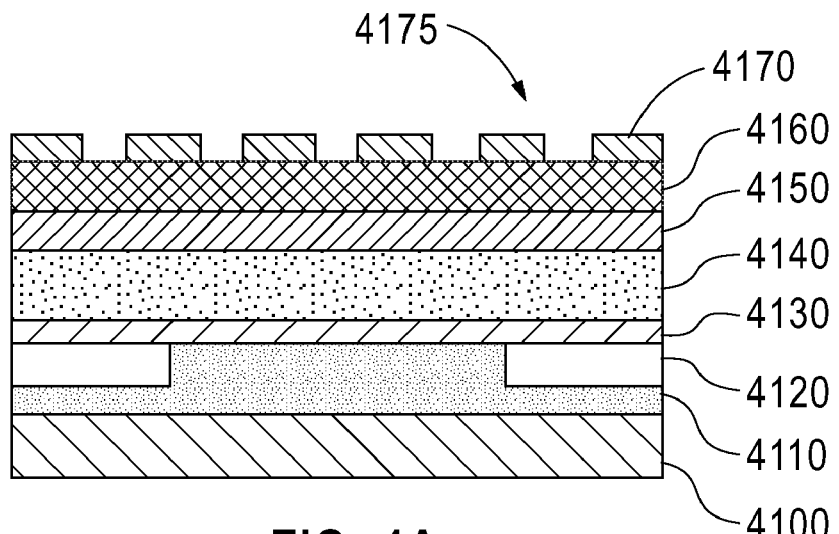
FIG. 4 is a schematic of the inventive process involving a multilayer hardmask scheme as described in greater detail herein below.
Figure 4B:
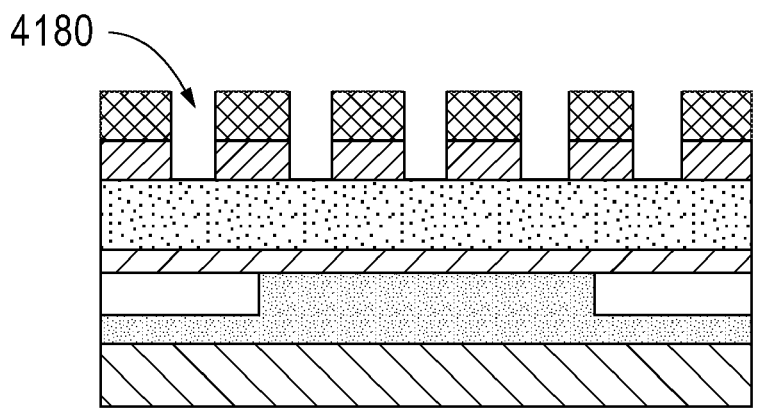
Figure 4C:
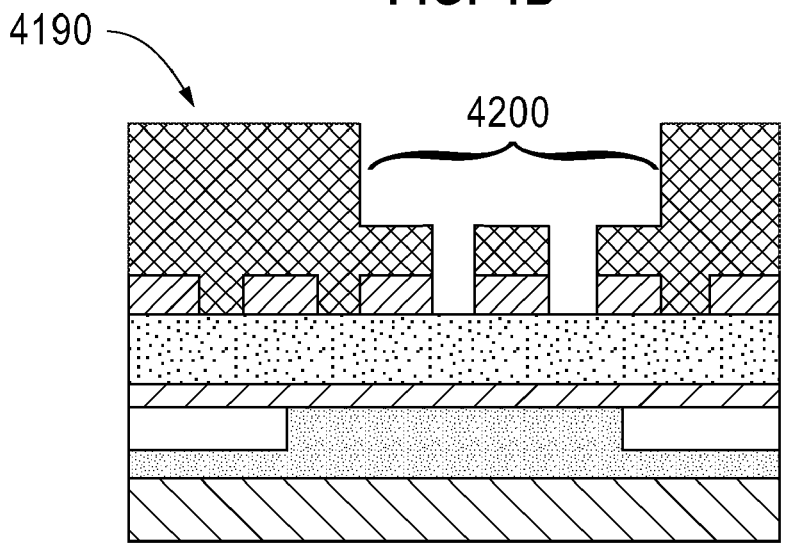
Figure 4D:
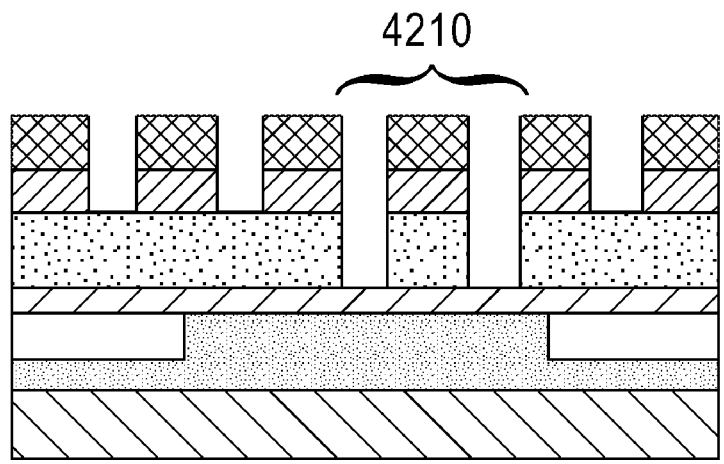
Figure 4E:
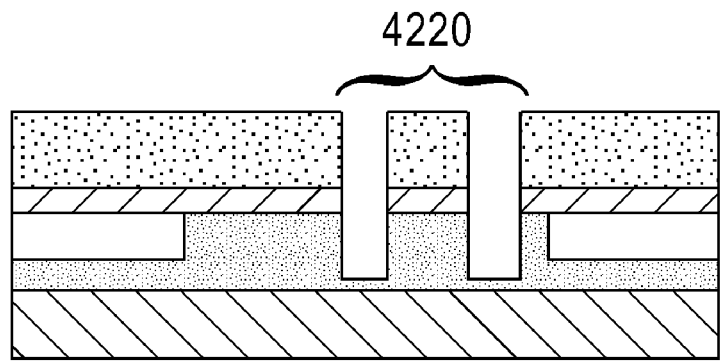
Figure 4F:
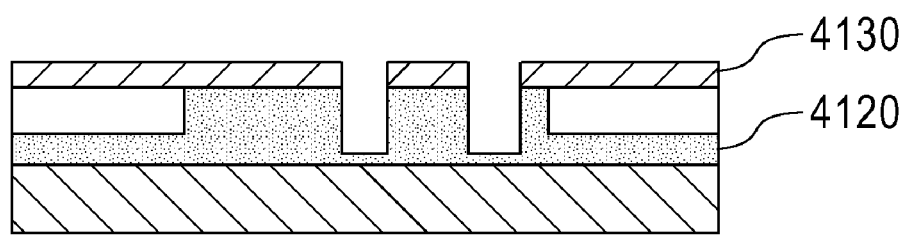
Figure 4G:
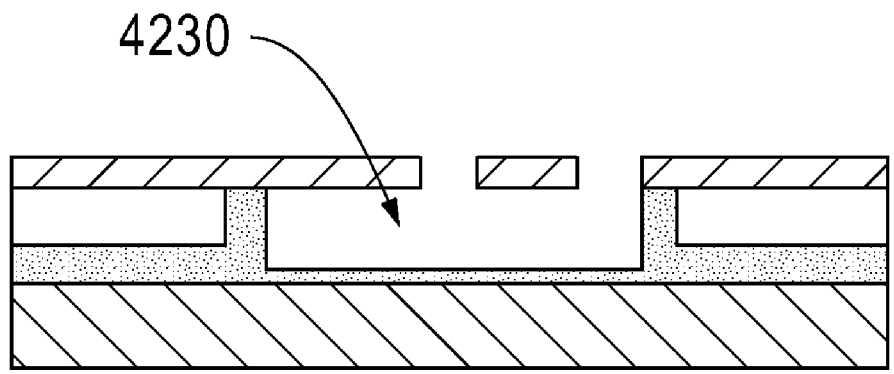
Figure 4H:
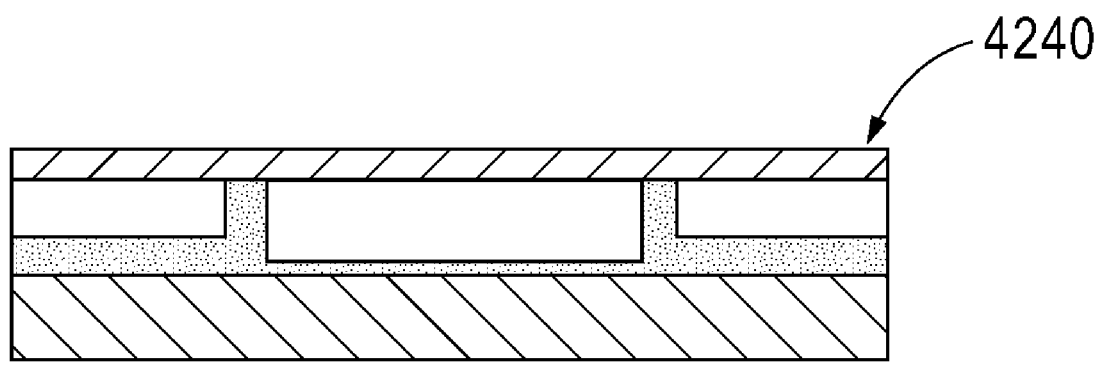

The pattern 4175 is transferred into the hardmask layer 4160 and optionally partially into the hardmask layer 4150 effectively generating the pattern 4180. A photoresist 4190 is patterned over the top of the pattern 4180. A region 4200 is revealed that is open to the underlying pattern. The convolved pattern 4210 is used to transfer in the underlying films 4150 and 4140 as shown in FIG. 4d. The regions protected by the resist are not transferred into the underlying film 4140. The new convolved pattern commensurate with the resist and self-assembled pattern is then transferred into the substrate to generate another structure 4220. The layers 4140-4160 are stripped to reveal a nanocolumnar pattern shown in FIG. 4f. The film 4130 that is perforated as indicated serves as a membrane through which the dielectric material 4120 can be extracted. A void 4230, or air bridge, is developed as shown in FIG. 4g. The perforated film 4130 is then capped with another dielectric deposition 2-240 as shown in FIG. 4h.

It should be understood that the preceding detailed description of the invention is merely a detailed description of one preferred embodiment or of a small number of preferred embodiments of the present invention and that numerous changes to the disclosed embodiment(s) can be made in accordance with the disclosure herein without departing from the spirit or scope of the invention. The preceding detailed description of the invention, therefore, is not meant to limit the scope of the invention in any respect. Rather, the scope of the invention is to be determined only by the appended issued claims and their equivalents.

We claim:

1. An electronics structure comprising:
   a) a substrate stack having a dielectric layer with at least one metallic interconnect structure within and a dielectric barrier layer above the dielectric layer;
   b) a multi-layer hardmask stack coated with a patterned self assembled layer, the multi-layer hardmask stack on the substrate stack; and
   c) a blocking layer on top of the self-assembled layer blocking a portion of the pattern;
   wherein the self-assembled layer pattern comprises nanoscale or microscale voids or combination of both nanoscale and microscale voids generated into the dielectric barrier layer and into the dielectric layer next to the metallic interconnect structure to create columns in the dielectric barrier layer and dielectric layer therein.

2. The structure according to claim 1, wherein the substrate comprises at least one semiconductor chip, microfluidic array, or micro fuel cell.

3. The structure according to claim 1, wherein the at least one metallic interconnect structure comprises at least one metallic line.

4. The structure according to claim 1, wherein the multi-layer hardmask stack comprises at least one of a planarizing material, an etch stop and a rework surface.

5. The structure according to claim 4, wherein the planarizing material exhibits plasma etch selectivity relative to a dielectric.

6. The structure according to claim 4, wherein the multi-layer hardmask stack comprises an etch stop and/or a rework surface, which are strippable.

7. The structure according to claim 4 wherein the multi-layer hardmask stack is stripped.

8. The structure according to claim 6, wherein the etch stop and/or rework surface are strippable or can be rendered strippable in hydrofluoric acid.

9. The structure according to claim 1, wherein the self-assembled layer is a diblock copolymer.

10. The structure according to claim 1, wherein the columns have a characteristic length-scale less than about 0.1 micron.

11. The structure according to claim 1, wherein the columns have a characteristic length-scale less than about 0.05 micron.

12. The structure according to claim 1, wherein the columns have a characteristic length-scale between about 0.05 micron and about 0.5 micron.

13. The structure according to claim 1 further comprising airgaps by removing a plurality of the columns in the dielectric layer.

14. A computer comprised of the electronics structure of claim 1.

15. An electronics structure comprising:
    a) a substrate stack having a dielectric layer with at least one metallic interconnect structure within and a dielectric barrier layer above the dielectric layer; and
    b) a multi-layer hardmask stack on the substrate stack;
    wherein a topmost layer of the multi-layer hardmask stack comprises a self-assembled layer with a pattern of nanoscale or microscale voids or combination of both nanoscale and microscale voids which are generated into the dielectric barrier layer and into the dielectric layer next to the metallic interconnect structure to create columns in the dielectric barrier layer and dielectric layer therein.

16. The structure according to claim 15, further comprising a material coated over a portion of the topmost layer of the multi-layer hardmask stack, thereby blocking a portion of the pattern, but leaving another portion of the pattern unblocked.

17. The structure according to claim 15, wherein the substrate comprises at least one semiconductor chip, microfluidic array, or micro fuel cell.

18. An electronics structure comprising:
    a) a substrate stack having a dielectric layer with at least one metallic interconnect structure within, the one metallic interconnect structure having at least one metallic line, and a dielectric barrier layer above the dielectric layer;
    b) a strippable multi-layer hardmask stack coated with a patterned diblock copolymer self assembled layer, and having at least one of a planarizing material, an etch stop and a rework surface are, the multi-layer hardmask stack on the substrate stack; and
    c) a resist coated on a topmost layer of the multi-layer hardmask stack thereby blocking a portion of the pattern, but leaving another portion of the pattern unblocked;
    wherein the patterned diblock copolymer self-assembled layer comprises a series of nanoscale or microscale voids or combination of both nanoscale and microscale voids generated into the dielectric barrier layer and into the dielectric layer next to the metallic interconnect structure to create columns in the dielectric barrier layer and dielectric layer therein.

19. The structure according to claim 18, wherein the substrate comprises at least one semiconductor chip, microfluidic array, or micro fuel cell.

20. The structure according to claim 18 wherein the multi-layer hardmask stack is stripped.

* * * * *